United States Patent
Kim et al.

(10) Patent No.: US 9,343,624 B2
(45) Date of Patent: *May 17, 2016

(54) LIGHT EMITTING DEVICE AND METHOD OF MANUFACTURING THE SAME

(71) Applicants: LG ELECTRONICS INC., Seoul (KR); LG INNOTEK CO., LTD., Seoul (KR)

(72) Inventors: Jong Wook Kim, Gyeonggi-do (KR); Hyun Kyong Cho, Seoul (KR); Gyu Chul Yi, Gyeongsangbuk-do (KR); Sung Jin An, Gyeongsangbuk-do (KR); Jin Kyoung Yoo, Gyeongsangbuk-do (KR); Young Joon Hong, Gyeongsangbuk-do (KR)

(73) Assignees: LG ELECTRONICS INC., Seoul (KR); LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/552,088

(22) Filed: Nov. 24, 2014

(65) Prior Publication Data

US 2015/0102370 A1    Apr. 16, 2015

Related U.S. Application Data

(63) Continuation of application No. 14/147,947, filed on Jan. 6, 2014, now Pat. No. 8,912,556, which is a continuation of application No. 13/489,158, filed on Jun. 5, 2012, now Pat. No. 8,643,035, which is a (Continued)

(30) Foreign Application Priority Data

Mar. 7, 2006    (KR) .................... 10-2006-0021443

(51) Int. Cl.
*H01L 33/22* (2010.01)
*H01L 33/32* (2010.01)

(Continued)

(52) U.S. Cl.
CPC ............... *H01L 33/22* (2013.01); *H01L 33/32* (2013.01); *H01L 33/36* (2013.01); *H01L 33/60* (2013.01);

(Continued)

(58) Field of Classification Search
CPC ............... H01L 2924/12041; H01L 51/5012; H01L 33/405; H01L 33/08; H01L 51/5203; H01L 27/15; H01L 33/22; H01L 33/42; H01L 51/5262; H01L 33/0075
See application file for complete search history.

(56) References Cited

U.S. PATENT DOCUMENTS 7,521,854 B2    4/2009    Erchak
7,534,633 B2    5/2009    Batres et al.

(Continued)

FOREIGN PATENT DOCUMENTS

JP    2000-133837 A    5/2000
JP    2000-196152 A    7/2000

(Continued)

*Primary Examiner* — Roy Potter
(74) *Attorney, Agent, or Firm* — Birch, Stewart, Kolasch & Birch, LLP

(57) ABSTRACT

A light emitting device is disclosed. The light emitting device includes a conductive support layer; a reflective layer disposed on the conductive support layer; a nitride semiconductor layer disposed on the reflective layer. Furthermore, the nitride semiconductor layer includes a second-type semiconductor layer on the reflective layer, an active layer on the second-type semiconductor layer, and a first-type semiconductor layer on the active layer; a light extraction structure disposed on the first-type semiconductor layer; and a first-type electrode disposed on the light extraction structure.

20 Claims, 9 Drawing Sheets

Related U.S. Application Data continuation of application No. 12/731,029, filed on Mar. 24, 2010, now Pat. No. 8,598,607, which is a continuation of application No. 11/707,167, filed on Feb. 16, 2007, now Pat. No. 7,714,337.

(51) Int. Cl.
*H01L 33/36* (2010.01)
*H01L 33/60* (2010.01)
*H01L 21/02* (2006.01)

(52) U.S. Cl.
CPC ......... *H01L 21/0237* (2013.01); *H01L 21/0242* (2013.01); *H01L 21/0254* (2013.01); *H01L 21/0262* (2013.01); *H01L 21/02458* (2013.01)

(56) References Cited

U.S. PATENT DOCUMENTS

| | | | |
|---|---|---|---|
| 7,704,763 | B2 | 4/2010 | Fujii et al. |
| 7,714,337 | B2 | 5/2010 | Kim et al. |
| 8,643,035 | B2 * | 2/2014 | Kim ................... H01L 33/60 |
| | | | 257/94 |

FOREIGN PATENT DOCUMENTS

| | | |
|---|---|---|
| JP | 2002-353500 A | 12/2002 |
| JP | 2003-46117 A | 2/2003 |
| JP | 2006-49855 A | 2/2006 |
| KR | 10-2004-0061696 A | 7/2004 |
| KR | 10-0448351 B1 | 9/2004 |
| KR | 10-0531073 B1 | 11/2005 |

* cited by examiner

US 9,343,624 B2

LIGHT EMITTING DEVICE AND METHOD OF MANUFACTURING THE SAME

CROSS-REFERENCE TO RELATED APPLICATIONS

This application is a Continuation of co-pending U.S. patent application Ser. No. 14/147,947 filed Jan. 6, 2014, which is a continuation of U.S. patent application Ser. No. 13/489,158 (now U.S. Pat. No. 8,643,035, issued Feb. 4, 2014), filed Jun. 5, 2012, which is a continuation of U.S. patent application Ser. No. 12/731,029 (now U.S. Pat. No. 8,598,607, issued Dec. 3, 2013), filed Mar. 24, 2010, which is a Continuation application of U.S. patent application Ser. No. 11/707,167 (now U.S. Pat. No. 7,714,337, issued May 11, 2010), filed Feb. 16, 2007, which claims the priority benefit of Korean Patent Application No. 10-2006-0021443, filed on Mar. 7, 2006. The entire contents of all of the above applications are hereby incorporated by reference.

BACKGROUND OF THE INVENTION

1. Field of the Invention

The present invention relates to a light emitting device and a method of manufacturing the same, and more particularly, to a light emitting diode having a plurality of nanocones formed at the surface thereof by epitaxial growth, whereby the light extraction efficiency of the light emitting diode is improved, and a method of manufacturing the same.

2. Discussion of the Related Art

Generally, a light emitting diode (LED) is a kind of semiconductor device that converts electricity into light using the characteristics of a compound semiconductor to transmit and receive a signal or is used as a light source. The light emitting diode generates high-efficiency light at low voltage with the result of high energy saving efficiency. Recently, the brightness of the light emitting diode, which was a limitation of the light emitting diode, has considerably improved, and therefore, the light emitting diode has been widely used throughout industry, such as backlight units, electric bulletin boards, display units, electric home appliances, and various kinds of automated equipment. Especially, a nitride light emitting diode has attracted considerable attention in the environmentally-friendly aspect because the energy band gap of an active layer constituting the nitride light emitting diode is wide with the result that light emitting spectrum is formed widely from ultraviolet rays to infrared rays, and the nitride light emitting diode does not contain environmentally hazardous materials, such as arsenic (As) and mercury (Hg).

In addition, research is being carried out on a light emitting diode having high brightness that is applicable in various applications. For example, a light emitting diode having high brightness may be obtained by improving the quality of an active layer of the light emitting diode to increase inner quantum efficiency or by assisting light generated from the active layer to be discharged to the outside and collecting the light in a desired direction to increase light extraction efficiency. Although attempts are being currently made to increase both the inner quantum efficiency and the light extraction efficiency, more active research is being carried out on a method of improving the electrode design, the shape, and the package of the light emitting diode to increase the light extraction efficiency than a method of improving the quality of a semiconductor material to increase the inner quantum efficiency.

Up to now, a method of increasing the transmissivity of an upper electrode of the light emitting diode or a method of disposing a reflection plate at the outside of the light emitting diode to gather light discharged to a sapphire substrate of the light emitting diode or the side of the light emitting diode upward has been mainly attempted. The light extraction efficiency is decided by the ratio of electrons injected into the light emitting diode to photons discharged from the light emitting diode. As the light extraction efficiency is increased, the brightness of the light emitting diode is increased. The light extraction efficiency of the light emitting diode is greatly affected by the shape or the surface state of a chip, the structure of the chip, and the package form of the chip. Consequently, it is necessary to pay careful attention when designing the light emitting diode.

For a light emitting diode with high output and high brightness, the light extraction efficiency acts as an important factor to decide the light emission efficiency of the light emitting diode. In a conventional method of manufacturing a nitride light emitting diode, however, the light extraction efficiency is limited.

FIG. 1 is a sectional view illustrating a conventional nitride light emitting diode. As shown in FIG. 1, the conventional nitride light emitting diode is constructed in a structure in which a buffer layer 11, an n-type nitride semiconductor layer 12, an active layer 13, and a p-type nitride semiconductor layer 14 are sequentially stacked on a sapphire substrate 10. Mesa etching is carried out from the p-type nitride semiconductor layer 14 to a portion of the n-type nitride semiconductor layer 12. As a result, the etched portion of the n-type nitride semiconductor layer 12 is exposed to the outside. An n-electrode 15 is formed on the exposed portion of the n-type nitride semiconductor layer 12. Also, a transparent electrode 16 is formed on the p-type nitride semiconductor layer 14, and a p-electrode 17 is formed on the transparent electrode 16.

A method of manufacturing the nitride light emitting diode is carried out as follows. First, a buffer layer 11, an n-type nitride semiconductor layer 12, an active layer 13, and a p-type nitride semiconductor layer 14 are sequentially formed on a sapphire substrate 10. Subsequently, mesa etching is carried out from the p-type nitride semiconductor layer 14 to a portion of the n-type nitride semiconductor layer 12 using a reactive ion etching (RIE) method. A transparent electrode 16 to improve the ohmic characteristics is formed on the p-type nitride semiconductor layer 14, and a p-electrode 17 is formed on the transparent electrode 16. Subsequently, an n-electrode 15 is formed on the mesa etched and thus exposed portion of the n-type nitride semiconductor layer.

The light emitting diode is driven as follows. When voltage is applied to the p-electrode 17 and the n-electrode 15, holes and electrons move from the p-type nitride semiconductor layer 14 and the n-type nitride semiconductor layer 12 to the active layer 13. The electrons and the holes are recoupled with each other in the active layer 13, whereby light is generated from the active layer 13. The light generated from the active layer 13 advances upward and downward from the active layer 13. The upward-advancing light is discharged to the outside through the transparent electrode 16 thinly formed on the p-type nitride semiconductor layer 14. On the other hand, the downward-advancing light is discharged downward through the substrate 10, and is then absorbed into solder used when packaging the light emitting diode, or else, the downward-advancing light is reflected by the substrate 10, moves upward, and is then reabsorbed into the active layer 13, or is discharged to the outside through the transparent electrode 16.

In the conventional nitride light emitting diode, however, a total reflection condition occurs due to the difference in a refractive index between a nitride semiconductor material and the outside when light generated from the active layer is discharged to the outside. As a result, light incident at an angle greater than the critical angle of the total reflection is not discharged to the outside but is reflected into the light emitting diode. Specifically, as shown in FIG. 2, when light generated from an active layer 30 reaches the surface of a nitride semiconductor material 40, the light is not discharged to the outside but is reflected into the light emitting diode if the incident angle of the incident light exceeds the critical angle $\theta_c$, which is decided by the outer refractive index and the refractive index of the nitride semiconductor material. The reflected light is diminished as the light passes through several channels.

The critical angle is decided by Snell's Law. Specifically, the critical angle may be obtained by the following equation.

$$\sin \theta_c = N_1/N_2 \qquad \text{[Equation 1]}$$

Where, $\theta_c$ is the critical angle, $N_1$ is the outer refractive index of the light emitting diode, and $N_2$ is the inner refractive index of the light emitting diode.

When the light generated from the active layer reaches the surface of the nitride semiconductor material as described above, the light is totally reflected into the light emitting diode and thus diminished, whereby the light extraction efficiency of the conventional nitride light emitting diode is lowered.

In order to solve the above-mentioned problem, there has been proposed a method of etching the surface of the light emitting diode to rough the surface of the light emitting diode. However, the etching process is further performed after the growth of the thin film on the light emitting diode, whereby the method of manufacturing the light emitting diode is complicated, and therefore, the time necessary for manufacturing the light emitting diode is increased. In addition, a conventional light emitting device package structure is manufactured by plastic injection molding, and therefore, the miniaturization and thin shaping possibilities of the light emitting device package structure are limited. Consequently, the conventional light emitting device package structure is not suitable for a current tendency requiring the reduction in weight and size of electronic products.

SUMMARY OF THE INVENTION

Accordingly, the present invention is directed to a light emitting device and a method of manufacturing the same that substantially obviate one or more problems due to limitations and disadvantages of the related art.

An object of the present invention is to provide a light emitting device wherein a plurality of nanocones are grown simultaneously at the step of growing a thin nitride film, whereby the surface of the light emitting device has surface roughness without an additional etching process and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device includes a buffer layer formed on a substrate, a nitride semiconductor layer including a first semiconductor layer, an active layer, and a second semiconductor layer, which are sequentially stacked on the buffer layer, a portion of the first semiconductor layer being exposed to the outside by performing mesa etching from the second semiconductor layer to the portion of the first semiconductor layer, and at least one nanocone formed on the second semiconductor layer.

In another aspect of the present invention, a method of manufacturing a light emitting device includes sequentially forming a buffer layer and a nitride semiconductor layer including a first semiconductor layer, an active layer, and a second semiconductor layer on a substrate, performing mesh etching from the second semiconductor layer to a portion of the first semiconductor layer to expose the portion of the first semiconductor layer to the outside, and forming a plurality of nanocones on the second semiconductor layer.

In another aspect of the present invention, a light emitting device includes an ohmic layer formed on a conductive support film, a nitride semiconductor layer formed on the ohmic layer, the nitride semiconductor layer including a second semiconductor layer, an active layer, and a first semiconductor layer, and at least one nanocone formed on the first semiconductor layer.

In a further aspect of the present invention, a method of manufacturing a light emitting device includes sequentially forming a nitride semiconductor layer including a first semiconductor layer, an active layer, and a second semiconductor layer on a substrate, and removing the substrate and forming a plurality of nanocones on the first semiconductor layer.

It is to be understood that both the foregoing general description and the following detailed description of the present invention are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OP THE INVENTION

Reference will now be made in detail to the preferred embodiments of the present invention, examples of which are illustrated in the accompanying drawings. Wherever possible, the same reference numbers will be used throughout the drawings to refer to the same or like parts.

A light emitting device according to the present invention is characterized in that nanocones are formed on a nitride semiconductor layer. Consequently, when light generated from an active layer reaches the surface of the light emitting device, the amount of light totally reflected into the light emitting device and thus diminished is reduced, whereby the light extraction efficiency of the light emitting device is improved.

Figure 1:
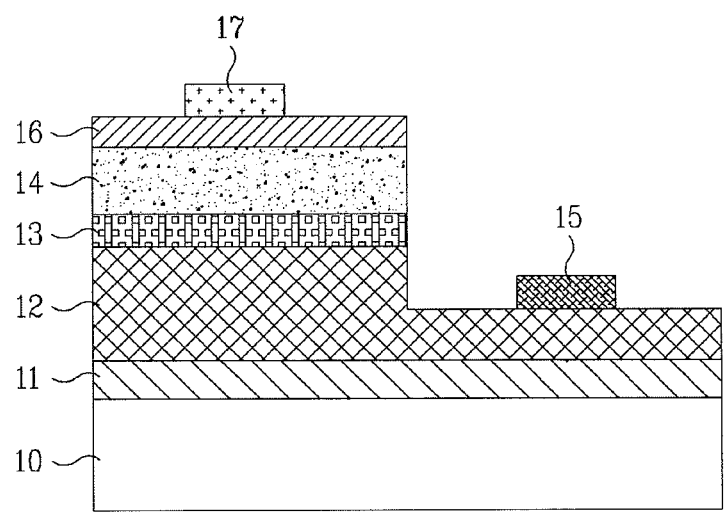
FIG. 1 is a sectional view illustrating a conventional nitride light emitting diode.
Figure 2:
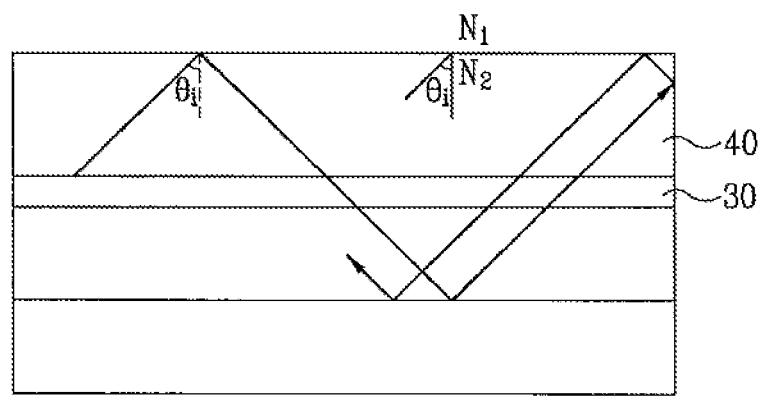
FIG. 2 is a view illustrating a principle in which light generated from an active layer of a conventional light emitting device is totally reflected from a nitride semiconductor surface.
Figure 3:
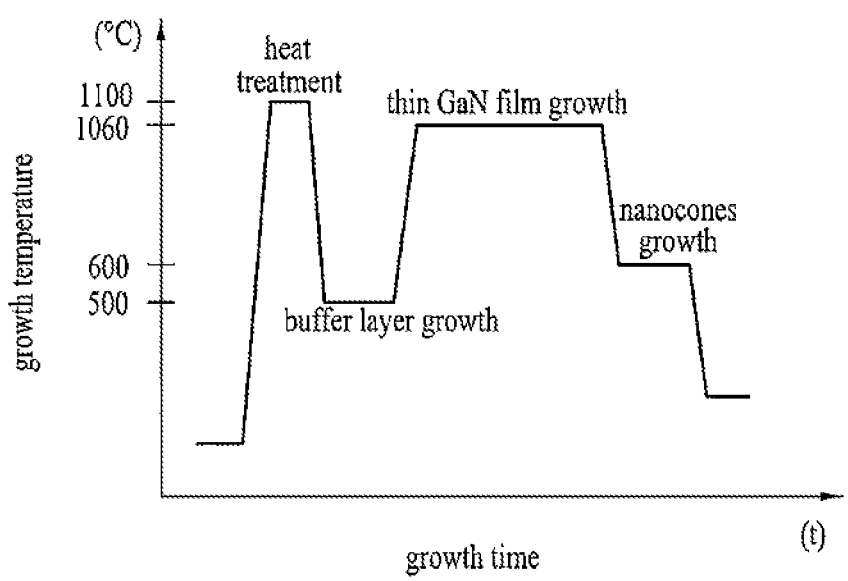
FIG. 3 is a graph illustrating the relationship between growth time and growth temperature in a nanocones growth method according to the present invention.

FIG. 3 is a graph illustrating the relationship between growth time and growth temperature in a nanocones growth method according to the present invention.

First, as shown in FIG. 3, a sapphire substrate is heat-treated at a temperature of 1100° C. for 10 minutes in a hydrogen atmosphere to remove an oxide film from the surface of the sapphire substrate. Next, an ammonia ($NH_3$) gas is injected to nitridate the sapphire substrate. Subsequently, the interior temperature (growth temperature) of the growth chamber is lowered to a temperature of 500° C., and a low-temperature GaN buffer layer is grown. Generally, there does not exist a substrate identical in a lattice constant and a coefficient of thermal expansion to a nitride semiconductor material, such as GaN. For this reason, a nitride semiconductor material, such as GaN, is normally grown on the sapphire substrate. At this time, a buffer layer having small thickness is formed at low temperature to reduce the difference in the lattice constant and the coefficient of thermal expansion between the sapphire substrate and the nitride semiconductor material grown on the sapphire substrate and thus to prevent deterioration of the crystallinity.

The low-temperature buffer layer may be grown using metal organic chemical vapor deposition (MOCVD) or molecular beam epitaxy (MBE). As the low-temperature buffer layer may be used a material having a formula of $Al_xIn_yGa_{(1-x-y)}N$ (where, $0 \le x \le 1$, $0 \le y \le 1$, and $0 \le x+y \le 1$) as well as the GaN layer. Preferably, the growth temperature of the low-temperature buffer layer is between 500 and 600° C.

Subsequently, the interior temperature of the growth chamber is raised to a temperature of 900 to 1100° C. (1060° C. in this embodiment), and then a thin nitride film having a formula of $Al_xIn_yGa_{(1-x-y)}N$ (where, $0 \le x \le 1$, $0 \le y \le 1$, and $0 \le x+y \le 1$) is grown for 60 minutes or more. At this time, it is more preferable to grow the thin nitride film after heat-treating the buffer layer for several minutes rather than to directly grow the thin nitride film at a temperature of 1060° C. When the GaN buffer layer is grown on the sapphire substrate at low temperature, a GaN crystal is primarily grown into the shape of an uneven column. A crystal grown at high temperature based on the GaN crystal starts to be grown evenly to the side. After the crystal is grown to a specific thickness, the crystal growth of a relatively even single crystal is possible.

When the thin nitride film having the formula of $Al_xIn_yGa_{(1-x-y)}N$ (where, $0 \le x \le 1$, $0 \le y \le 1$, and $0 \le x+y \le 1$) is grown on the above-described buffer layer, tri-methyl-aluminum (TMAl) or tri-ethyl-aluminum (TEAl) is used as an Al source, tri-methyl-indium (TMIn) or tri-ethyl-indium (TEIn) is used as an In source, and tri-methyl-gallium (TMGa) or tri-ethyl-gallium (TEGa) is used as a Ga source. In addition, a $NH_3$ or $N_2$ gas is used as an N source, and a hydrogen ($H_2$) gas is used as a carrier gas to carry Al, In and Ga sources. When a thin GaN film is grown, for example, tri-methyl-gallium (TMGa) and $NH_3$ gases, which are reaction precursors, are injected into a reactor at a speed of 1 to 50 sccm and 1000 to 2000 sccm, respectively, using a hydrogen gas, and then the materials are chemically reacted with each other at the top of the buffer layer to grow the thin GaN film.

At this time, it is preferable for the hydrogen gas, which is a carrier gas, to have an amount of 1500 to 3000 sccm. For a p-type thin GaN film, bis(cyclopentyl)magnesium (($C_5H_5$)$_2$Mg) is injected into the reactor to deposit a magnesium-doped thin GaN film, which is heat-treated such that the magnesium-doped thin GaN film is activated, whereby the p-type thin GaN film is grown. For an n-type thin GaN film, on the other hand, silane ($SiH_4$) is injected into the reactor to deposit a silicon-doped thin GaN film, which is heat-treated such that the magnesium-doped thin GaN film is activated, whereby the n-type thin GaN film is grown. At the step of growing the thin nitride film, an n-type nitride semiconductor layer, an active layer, and a p-type nitride semiconductor layer may be sequentially stacked on the low-temperature buffer layer to form a light emitting structure.

Subsequently, the interior temperature of the growth chamber is lowered to a temperature of 400 to 900° C., and then a plurality of nanocones are grown on the thin nitride film for 10 to 40 minutes. At this time, tri-methyl-gallium (TMGa) and $NH_3$ gases, which are reaction precursors, are injected into the reactor at a speed of 1 to 50 sccm and 100 to 1000 sccm, respectively, using a hydrogen gas. Also, the amount of the hydrogen gas, which is a carrier gas, is reduced to a half or more, and the hydrogen gas is injected into the reactor at a speed of 300 to 1000 sccm to grow a plurality of nanocones on the thin nitride film. Preferably, the nanocones have a size of 10 nm to 1000 nm. When the nanocones are grown, the growth temperature is lowered, and the flow rate of the $NH_3$ gas is reduced as compared to when the thin nitride film is grown, whereby the nanocones are formed in the shape of a pyramid.

That is, the growth temperature is lowered, and the flow rate of the $NH_3$ gas is reduced such that the vertical growth is superior to the horizontal growth, whereby the nanocones are grown. In this case, the flow rate of the $NH_3$ gas corresponds to approximately ⅓ to ½ that of the gas when the thin nitride film is grown.

FIGS. 4A to 4D are sectional views schematically illustrating a first embodiment of light emitting device according to the present invention and a method of manufacturing the same.

Figure 4A:
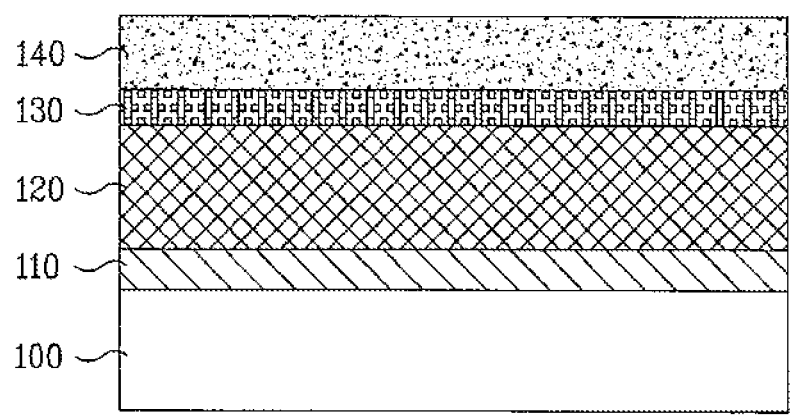
FIGS. 4A to 4D are sectional views illustrating a first embodiment of light emitting device according to the present invention and a method of manufacturing the same.

First, a buffer layer 110, an n-type nitride semiconductor layer 120, an active layer 130, and a p-type nitride semiconductor layer 140 are sequentially stacked on a substrate 100 (see FIG. 4A). The substrate 100 may be a sapphire ($Al_2O_3$) substrate, a silicon carbide (SiC) substrate, a silicon (Si) substrate, a gallium arsenide (GaAs) substrate, or a quartz substrate. Among them, the sapphire substrate is preferably used as the substrate 100 according to the present invention. The buffer layer 110 serves to eliminate the lattice mismatch between the substrate 100 and a nitride semiconductor material and the difference in a coefficient of thermal expansion between the substrate 100 and the nitride semiconductor material. A low-temperature growth GaN or AlN layer is used as the buffer layer 110.

The n-type nitride semiconductor layer 120 is made of an n-doped semiconductor material having a formula of $Al_xIn_yGa_{(1-x-y)}N$ (where, $0 \le x \le 1$, $0 \le y \le 1$, and $0 \le x+y \le 1$). Preferably, the n-type nitride semiconductor layer 120 is made of n-GaN. The active layer 130 has a multi-quantum well (MQW) structure. The active layer 130 may be made of GaN or InGaN. Also, the p-type nitride semiconductor layer 140 is made of a nitride semiconductor material having a formula of $Al_xIn_yGa_{(1-x-y)}N$ (where, $0 \le x \le 1$, $0 \le y \le 1$, and $0 \le x+y \le 1$), like the n-type nitride semiconductor layer 120. The nitride semiconductor material is p-doped. The buffer layer 110, the n-type nitride semiconductor layer 120, the active layer 130, and the p-type nitride semiconductor layer 140 formed on the substrate 100 may be grown using vapor deposition, such as metal organic chemical vapor deposition (MOCVD), molecular beam epitaxy (MBE), or hydride vapor phase epitaxy (HVPE).

The n-type nitride semiconductor layer 120, the active layer 130, and the p-type nitride semiconductor layer 140 are grown at a temperature of 700 to 1100° C.

Figure 4B:
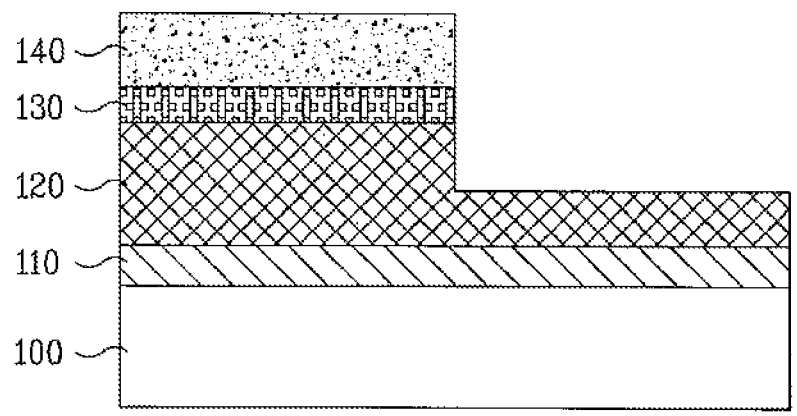

Subsequently, mesa etching is carried out from the p-type nitride semiconductor layer 140 to a portion of the n-type nitride semiconductor layer 120 such that the etched portion of the n-type nitride semiconductor layer 120 is exposed to the upside (see FIG. 4B). When an insulative substrate, such as the sapphire substrate, is used as the substrate 100, it is not possible to form an electrode at the bottom of the substrate 100. Consequently, the mesa etching is carried out from the p-type nitride semiconductor layer 140 to a portion of the n-type nitride semiconductor layer 120 so as to secure a space necessary to form the electrode. After the mesa etching is carried out, a process for forming a transparent electrode on the p-type nitride semiconductor layer 140 may be further performed. The p-type nitride semiconductor layer 140 has low dopant concentration. As a result, the contact resistance of the p-type nitride semiconductor layer 140 is high, and therefore, the p-type nitride semiconductor layer 140 has a poor ohmic characteristic. In order to improve the ohmic characteristic of the p-type nitride semiconductor layer 140, therefore, the transparent electrode is formed on the p-type nitride semiconductor layer 140. The transparent electrode may be constructed in a dual-layered structure including nickel (Ni) and gold (Au). Alternatively, the transparent electrode may be made of indium tin oxide (ITO). The transparent electrode forms an ohmic contact, while increasing the current injection area, to decrease forward voltage $V_f$.

Figure 4C:
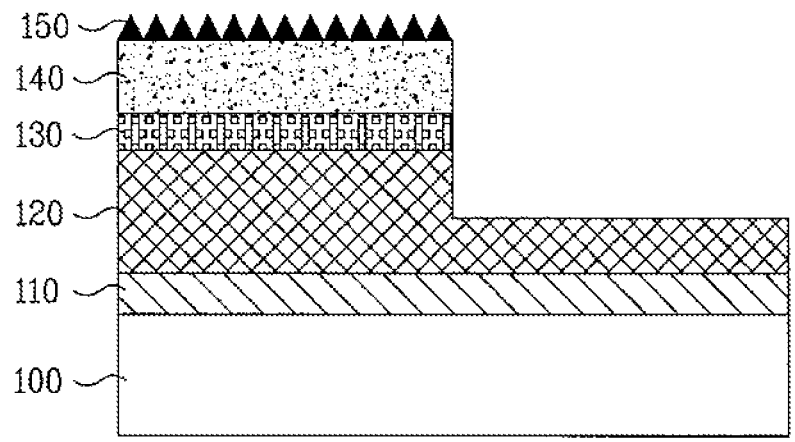

Subsequently, a plurality of nanocones 150 are grown on the p-type nitride semiconductor layer 140 (see FIG. 4C). The nanocones 150 are grown at low temperature, i.e., at a temperature of 400 to 900° C., preferably 600 to 800° C., using metal organic chemical vapor deposition (MOCVD). The nanocones 150 are made of a nitride semiconductor material having a formula of $Al_xIn_yGa_{(1-x-y)}N$ (where, $0 \le x \le 1$, $0 \le y \le 1$, and $0 \le x+y \le 1$). Preferably, the nanocones 150 have a size of 10 nm to 1000 nm. Unlike the n-type nitride semiconductor layer 120, the active layer 130, and the p-type nitride semiconductor layer 140, the nanocones 150 are grown at low temperature, i.e., at a temperature of 400 to 900° C., and low flow rate of the $NH_3$ gas.

As described above, the plurality of nanocones 150 are formed on the p-type nitride semiconductor layer 140 by controlling the temperature and the flow rate of the $NH_3$ gas. Specifically, when the nanocones 150 are grown, a ratio of the horizontal growth to the vertical growth is controlled to form the nanocones 150 in the shape of a pyramid. The controllable parameters are the growth temperature and the flow rate of the $NH_3$ gas. When the growth temperature is raised, and the flow rate of the $NH_3$ gas is increased, the horizontal growth is increased. When the growth temperature is lowered, and the flow rate of the $NH_3$ gas is decreased, on the other hand, the vertical growth is increased. It is also possible to form the nanocones 150 into various desired shapes by controlling the growth parameters as described above.

Figure 4D:
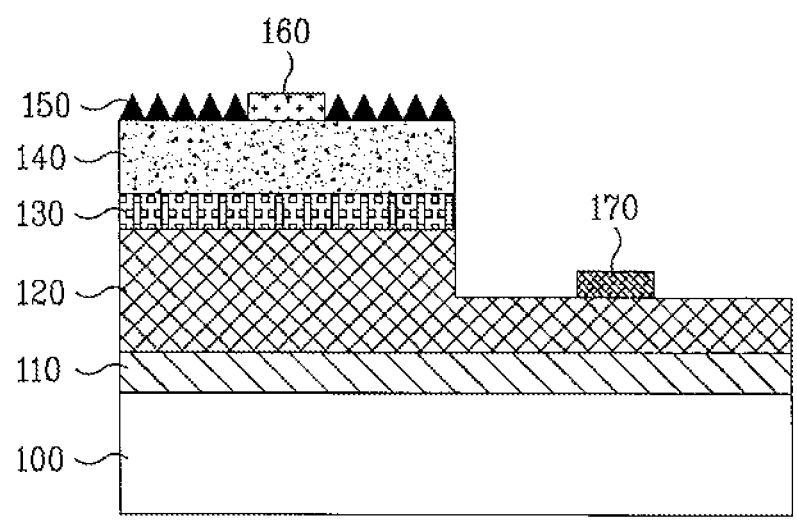

Subsequently, the nanocones 150 are partially removed, a p-electrode 160 is formed on a portion of the p-type nitride semiconductor layer 140 where the nanocones 150 are removed, and an n-electrode 170 is formed on the exposed portion of the n-type nitride semiconductor layer 120 (see FIG. 4D). The p-electrode 160 may be formed on the nanocones 150. The p-electrode 160 and the n-electrode 170 are made of any one selected from a group consisting of chrome (Cr), nickel (Ni), gold (Au), aluminum (Al), titanium (Ti), and platinum (Pt), or an alloy thereof.

In the first embodiment of light emitting device according to the present invention and the method of manufacturing the same, the plurality of nanocones are grown simultaneously at the step of growing the thin nitride film. Consequently, the surface of the light emitting device has surface roughness without an additional etching process, whereby the manufacturing process is simplified, and therefore, the time necessary for manufacturing the light emitting diode is reduced.

FIGS. 5A to 5E are sectional views schematically illustrating a second embodiment of light emitting device according to the present invention and a method of manufacturing the same.

Figure 5A:
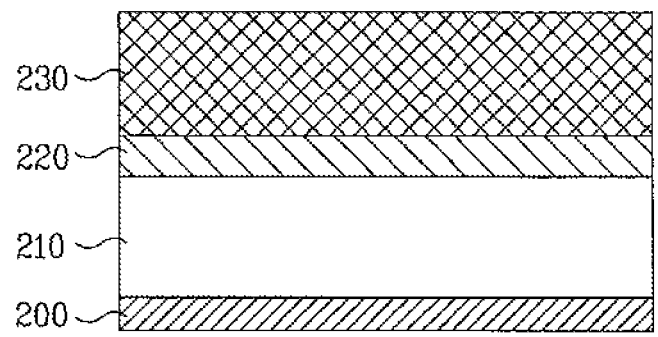
FIGS. 5A to 5E are sectional views illustrating a second embodiment of light emitting device according to the present invention and a method of manufacturing the same.
Figure 5B:
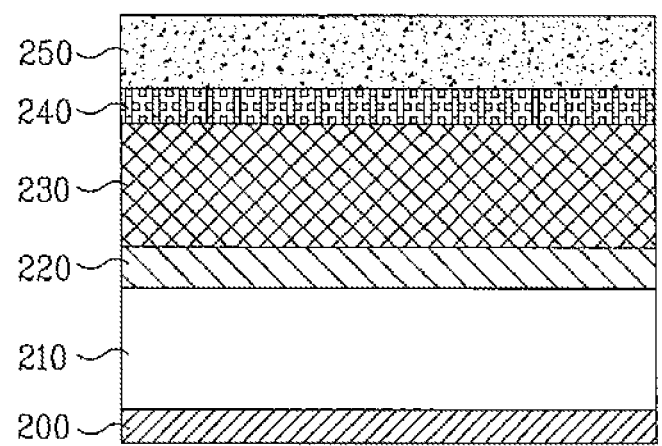

First, an n-type nitride semiconductor layer 210, an active layer 220, and a p-type nitride semiconductor layer 230 are sequentially stacked on a substrate 200 (see FIG. 5A). Subsequently, an ohmic layer 240 and a conductive support film 250 are sequentially formed on the p-type nitride semiconductor layer 230 (see FIG. 5B). The ohmic layer 240 is made of a thin metal film including nickel (Ni) and gold (Au). The thin metal film mainly including nickel (Ni) is heat-treated in an oxygen atmosphere to form an ohmic contact having a specific contact resistance of approximately $10^{-3}$ to $10^{-4}$ $\Omega cm^2$. When the thin metal film including nickel (Ni) and gold (Au) is used as the ohmic layer 240, the reflexibility of the ohmic layer 240 is highly increased, and therefore, it is possible for the ohmic layer 240 to effectively reflect light emitted from the active layer 220. Consequently, it is possible to obtain a reflecting effect without the formation of an addition reflector.

The conductive support film 250 serves as a p-electrode. Consequently, it is preferable to form the conductive support film 250 using metal having high electrical conductivity. In addition, it is required for the conductive support film 250 to sufficiently diffuse heat generated during the operation of the light emitting device. Consequently, it is preferable to form the conductive support film 250 using metal having high thermal conductivity. Furthermore, in order to separate a wafer into a plurality of individual chips through a scribing process and a breaking process while the entire wafer is not bent during the formation of the conductive support film 250, it is required for the conductive support film 250 to have mechanical strength to some extent. Consequently, it is preferable to form the conductive support film 250 using an alloy of soft metal having high thermal conductivity, such as gold (Au), copper (Cu), silver (Ag), and aluminum (Al) and hard metal which has a crystal structure and a crystal lattice constant similar to those of the above-specified soft metal to minimize the occurrence of internal stress when the alloy is made and has high mechanical strength, such as nickel (Ni), cobalt (Co), platinum (Pt), and palladium (Pd).

Figure 5C:
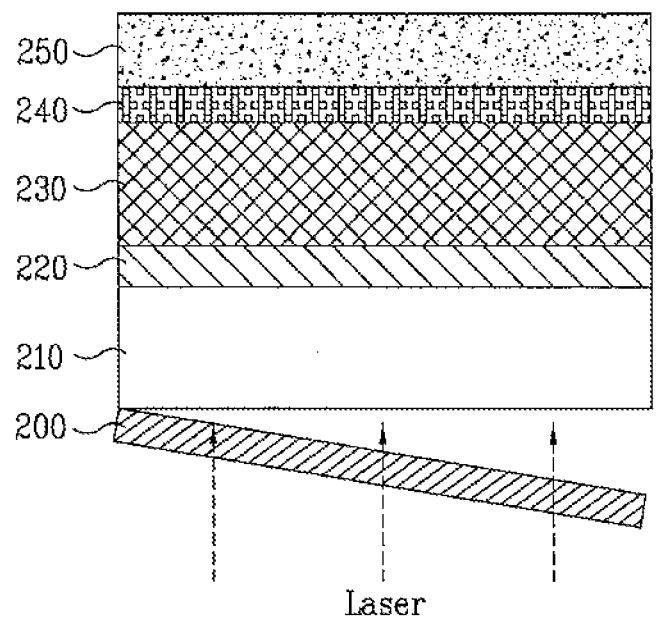

Subsequently, the substrate 200 is removed from the n-type nitride semiconductor layer 210 (see FIG. 5C). The removal of the substrate 200 may be carried out by a laser lift off (LLO) method using excimer laser or a dry-type and wet-type etching method. Preferably, the removal of the substrate 200 is carried out by the laser lift off (LLO) method. Specifically, when excimer laser light having a specific wavelength range is focused and irradiated on the substrate 200, thermal energy is concentrated on the interface between the substrate 200 and the n-type nitride semiconductor layer 210. As a result, gallium and nitrogen molecules are separated from each other at the surface of the n-type nitride semiconductor layer 210, and therefore, the substrate 200 is instantaneously separated from the n-type nitride semiconductor layer 210 at the position where the laser light is transmitted.

Figure 5D:
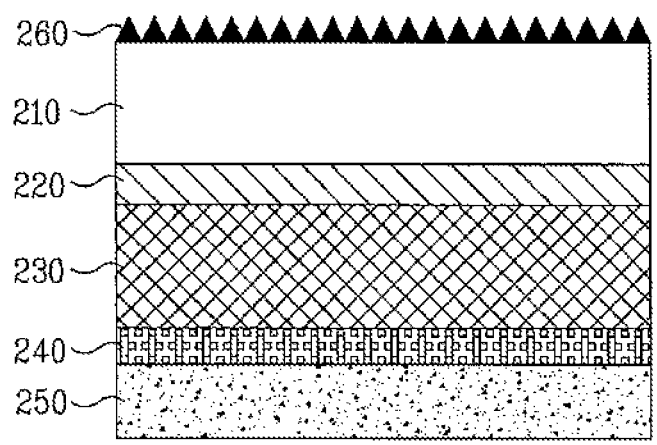

Subsequently, a plurality of nanocones 260 are grown on the p-type nitride semiconductor layer 210 (see FIG. 5D). The nanocones 260 are grown at low temperature, i.e., at a temperature of 400 to 900° C., preferably 600 to 800° C., using metal organic chemical vapor deposition (MOCVD). The nanocones 260 are made of a nitride semiconductor material having a formula of $Al_xIn_yGa_{(1-x-y)}N$ (where, $0 \leq x \leq 1$, $0 \leq y \leq 1$, and $0 \leq x+y \leq 1$). Preferably, the nanocones 260 have a size of 10 nm to 1000 nm. Unlike the n-type nitride semiconductor layer 210, the active layer 220, and the p-type nitride semiconductor layer 230, the nanocones 150 are grown at low temperature, i.e., at a temperature of 400 to 900° C., and low flow rate of the $NH_3$ gas.

Figure 5E:
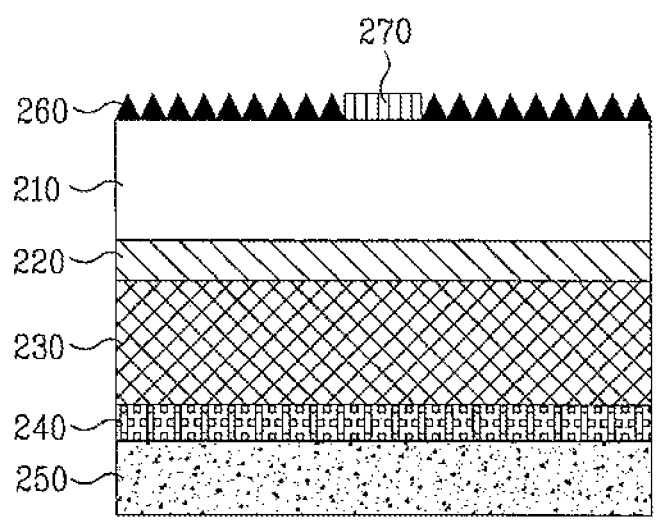

Subsequently, the nanocones 260 are partially removed, an n-electrode 270 is formed on a portion of the p-type nitride semiconductor layer 210 where the nanocones 260 are removed (see FIG. 5E). Meanwhile, the n-electrode 160 may be formed on the nanocones 260 as in the first embodiment of light emitting device and the method of manufacturing the same.

Figure 6:
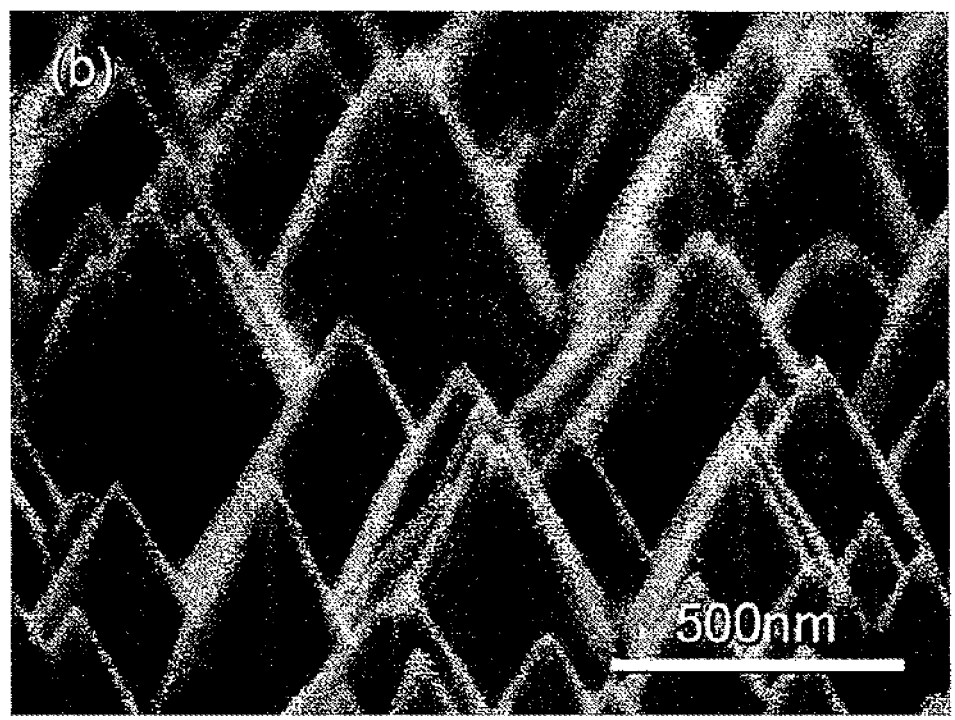
FIG. 6 is a scanning electron microscope (SEM) photograph illustrating nanocones according to the present invention.

FIG. 6 is a scanning electron microscope (SEM) photograph illustrating nanocones according to the present invention.

As shown in FIG. 6, a plurality of nanocones are formed at the surface of a light emitting diode. Consequently, when light generated from an active layer reaches the surface of the light emitting diode, the amount of light totally reflected into the light emitting device and thus diminished is reduced.

As apparent from the above description, the present invention is characterized in that a plurality of nanocones are grown simultaneously at the step of growing a thin nitride film, whereby the surface of a light emitting device has surface roughness without an additional etching process. Consequently, the manufacturing process is simplified, and therefore, the time necessary for manufacturing the light emitting device is reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device, comprising:
    a conductive support layer;
    a reflective layer disposed on the conductive support layer;
    a nitride semiconductor layer disposed on the reflective layer, wherein the nitride semiconductor layer includes a second-type semiconductor layer on the reflective layer, an active layer on the second-type semiconductor layer, and a first-type semiconductor layer on the active layer;
    a light extraction structure disposed on the first-type semiconductor layer; and
    a first-type electrode disposed next to the light extraction structure.

2. The light emitting device of claim 1, wherein the light extraction structure includes a plurality of cones.

3. The light emitting device of claim 2, wherein a top of any of the cones is higher than a middle between a top surface of the first-type electrode and a bottom surface of the first-type electrode, on a top surface of the first-type semiconductor layer.

4. The light emitting device of claim 1, wherein the conductive support layer includes a soft metal and a hard metal.

5. The light emitting device of claim 4, wherein the soft metal includes Au, Cu, Ag, and Al.

6. The light emitting device of claim 4, wherein the hard metal includes Ni, Co, Pt, and Pd.

7. The light emitting device of claim 1, wherein the reflective layer includes a metal.

8. The light emitting device of claim 7, wherein the metal includes Ni and Au.

9. The light emitting device of claim 1, wherein the reflective layer has a specific contact resistance of 10-3 Ωcm2 to 10-4 Ωcm2.

10. The light emitting device of claim 2, wherein the cones are disposed under and beside the first-type electrode.

11. The light emitting device of claim 2, wherein at least one of the cones is a nano scale cone.

12. The light emitting device of claim 11, wherein the nano scale cone has a size of 10 nm to 1000 nm.

13. The light emitting device of claim 2, wherein the cones are made of a nitride semiconductor material.

14. The light emitting device of claim 13, wherein the nitride semiconductor material of the cones has a formula of AlxInyGa(1-x-y)N (where, $0 \leq x \leq 1$, $0 \leq y \leq 1$, and $0 \leq x+y \leq 1$).

15. The light emitting device of claim 2, wherein the at least one of the cones is formed with a shape of a pyramid.

16. The light emitting device of claim 1, wherein the active layer includes InGaN, and at least one of the first-type semiconductor layer or the second-type semiconductor layer includes AlGaN.

17. The light emitting device of claim 1, wherein the light extraction structure includes substantially the same material as that of the nitride semiconductor layer.

18. The light emitting device of claim 1, wherein the light extraction structure is a part of the nitride semiconductor layer.

19. The light emitting device of claim 2, wherein the cones do not overlap each other.

20. The light emitting device of claim 1, wherein the light extraction structure is disposed on an entire upper surface of the first-type semiconductor layer.

* * * * *